US010224062B1

(12) United States Patent
Savell

(10) Patent No.: US 10,224,062 B1
(45) Date of Patent: Mar. 5, 2019

(54) SAMPLE RATE CONVERSION WITH PITCH-BASED INTERPOLATION FILTERS

(71) Applicant: Microsoft Technology Licensing, LLC, Redmond, WA (US)

(72) Inventor: Thomas C. Savell, Scotts Valley, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 15/966,646

(22) Filed: Apr. 30, 2018

Related U.S. Application Data

(60) Provisional application No. 62/625,404, filed on Feb. 2, 2018.

(51) Int. Cl.
| | |
|---|---|
| *G10L 21/0208* | (2013.01) |
| *G10L 25/90* | (2013.01) |
| *G10L 19/02* | (2013.01) |
| *G10L 19/26* | (2013.01) |
| *G10K 11/178* | (2006.01) |

(52) U.S. Cl.
CPC ............. *G10L 25/90* (2013.01); *G10L 19/02* (2013.01); *G10L 19/26* (2013.01)

(58) Field of Classification Search
CPC ..... G10L 21/0208; G10L 25/90; G10L 19/02; G10L 19/26; G10K 2210/3051; G10K 11/16; G10K 11/17854; G10K 2210/108; H04R 3/04
USPC ............ 381/61, 71.11, 94.1, 317, 71.1, 94.4, 381/94.7, 58, 71.14, 94.5; 341/61; 704/207, 226; 455/296
See application file for complete search history.

(56) References Cited

U.S. PATENT DOCUMENTS

| 5,495,432 A | 2/1996 | Ho |
| 5,644,677 A | 7/1997 | Park et al. |
| 5,744,739 A | 4/1998 | Jenkins |
| 6,163,614 A | 12/2000 | Chen |

(Continued)

OTHER PUBLICATIONS

Ye, et al., "Analysis of Multistage Sampling Rate Conversion for Potential Optimal Factorization", In Proceedings of 10th International Conference on Sampling Theory and Applications, Jul. 1, 2013, pp. 244-247.

(Continued)

*Primary Examiner* — Norman Yu
(74) *Attorney, Agent, or Firm* — Ranjeev Singh; Singh, Law, PLLC

(57) ABSTRACT

Sample rate converter and related methods are provided. A method may include (1) obtaining a pitch value based at least on a relationship between an input sampling rate of input samples of a first audio signal to an output sampling rate of output samples corresponding to a second audio signal; (2) automatically generating a first set of interpolated coefficient values by interpolating between a first set of coefficient values corresponding to a first filter and automatically generating a second set of interpolated coefficient values by interpolating between a second set of coefficient values corresponding to a second filter; (3) automatically generating a third set of coefficient values by interpolating between the first set of interpolated coefficient values and the second set of interpolated coefficient values using a set of fraction values related to the pitch value; and (4) filtering data corresponding to the input samples.

20 Claims, 12 Drawing Sheets

(56) References Cited

U.S. PATENT DOCUMENTS

| | | |
|---|---|---|
| 7,280,878 B1 | 10/2007 | Rossum |
| 7,489,259 B2 | 2/2009 | Savell |
| 7,514,620 B2 | 4/2009 | Friedman et al. |
| 8,542,786 B2 | 9/2013 | Wei |
| 9,236,064 B2 | 1/2016 | Savell |
| 2013/0211827 A1* | 8/2013 | Savell .............. G11B 20/10046 704/207 |

OTHER PUBLICATIONS

John, "Pitch shifting via sample-rate conversion", Retrieved From <<http://www.moellerstudios.org/pitch-shifting-via-sample-rate-conversion/>>, May 10, 2017, 4 Pages.

Smith, et al., "A Flexible Sampling-rate Conversion Method", In Proceedings of the International Conference on Acoustics, Speech, and Signal Processing, Mar. 19, 1984, 4 Pages.

Artur, et al., "DSP System Design", In Publication of Springer, 2003.

Vaidyanathan, P. P., "Multirate Systems and Filter Banks", In Publication of Prentice-Hall, 1993.

\* cited by examiner

SAMPLE RATE CONVERSION WITH PITCH-BASED INTERPOLATION FILTERS

CROSS-REFERENCE TO A RELATED APPLICATION

This application claims the benefit of U.S. Provisional Application No. 62/625,404, filed Feb. 2, 2018, titled "SAMPLE RATE CONVERSION WITH PITCH-BASED INTERPOLATION," the entire contents of which are hereby incorporated herein by reference.

BACKGROUND

Audio signal processing involves the use of filters to process the audio signal. The audio signal can be processed both in the frequency domain and the time domain. The processing of audio signals in each of these domains relies upon the use of digital signal processing techniques. Some of these techniques involve the use of a sample rate converter to process the audio signals. While various audio processing techniques have been somewhat effective in processing audio signals, there is a need for systems and methods for sample rate conversion with pitch-based interpolation filters.

SUMMARY

In one example, the present disclosure relates to a method comprising obtaining a pitch value based at least on a relationship between an input sampling rate of input samples corresponding to a first audio signal to an output sampling rate of output samples corresponding to a second audio signal. The method further includes automatically generating a first set of interpolated coefficient values by interpolating between a first set of coefficient values corresponding to a first filter and automatically generating a second set of interpolated coefficient values by interpolating between a second set of coefficient values corresponding to a second filter. The method further includes automatically generating a third set of coefficient values by interpolating between the first set of interpolated coefficient values and the second set of interpolated coefficient values using a set of fraction values related to the pitch value, wherein the set of fraction values is determined based on an analysis of a relationship between step increases in the fraction values and a corresponding filter responses associated with at least one of the first filter or the second filter, and wherein the analysis comprises selecting one of the filter responses. The method further includes filtering data corresponding to the input samples using at least one of the first set of coefficient values, the second set of coefficient values, or the third set of coefficient values to generate the output samples.

In another example, the present disclosure relates to a device comprising a sample rate converter configured to obtain a pitch value based at least on a relationship between an input sampling rate of input samples corresponding to a first audio signal to an output sampling rate of output samples corresponding to a second audio signal. The sample rate converter is further configured to automatically generate a first set of interpolated coefficient values by interpolating between a first set of coefficient values corresponding to a first filter and automatically generating a second set of interpolated coefficient values by interpolating between a second set of coefficient values corresponding to a second filter. The sample rate converter is further configured to automatically generate a third set of coefficient values by interpolating between the first set of interpolated coefficient values and the second set of interpolated coefficient values using a set of fraction values related to the pitch value, wherein the set of fraction values is determined based on an analysis of a relationship between step increases in the fraction values and corresponding filter responses associated with at least one of the first filter or the second filter, and wherein the analysis comprises selecting one of the filter responses. The sample rate converter is further configured to filter data corresponding to the input samples using at least one of the first set of coefficient values, the second set of coefficient values, or the third set of coefficient values to generate the output samples.

In yet another example, the present disclosure relates to a system comprising a buffer configured to store input samples corresponding to an audio signal. The system further includes an audio control processor configured to provide the input samples to the sample rate converter. The sample rate converter is configured to obtain a pitch value from the audio control processor, wherein the pitch value is based at least on a relationship between an input sampling rate of input samples corresponding to a first audio signal to an output sampling rate of output samples corresponding to a second audio signal. The sample rate converter is further configured to automatically generate a first set of interpolated coefficient values by interpolating between a first set of coefficient values corresponding to a first filter and automatically generating a second set of interpolated coefficient values by interpolating between a second set of coefficient values corresponding to a second filter. The sample rate converter is further configured to automatically generate a third set of coefficient values by interpolating between the first set of interpolated coefficient values and the second set of interpolated coefficient values using a set of fraction values related to the pitch value, wherein the set of fraction values is determined based on an analysis of a relationship between step increases in the fraction values and corresponding filter responses associated with at least one of the first filter or the second filter, and wherein the analysis comprises selecting one of the filter responses. The sample rate converter is further configured to filter data corresponding to the input samples using at least one of the first set of coefficient values, the second set of coefficient values, or the third set of coefficient values to generate the output samples.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to audio signal processing. Certain examples relate to using techniques that involve sample rate conversion. While these techniques have been somewhat effective in processing audio signals, the complexity of the wide range of sounds required to create a satisfying user experience places additional demands on such techniques. Certain examples relate to sample rate conversion with pitch-based interpolation filters. As an example, systems and methods related to this disclosure may be used as part of a three-stage sample rate converter. Sample rate conversion may include modifying the delta time between successive audio samples in an audio stream. This process may include steps such as upsampling the input audio signal, band-limiting the signal to the lower of the input or output sample rates, and selecting the right samples from the band-limited upsampled signal to output and create the new output stream. In certain examples, a digital audio stream may have a single, fixed sample rate such as 48 kHz (common for PCs and digital video) or 44.1 kHz (common for commercially released popular music tracks). A pitch of the audio signal may be a ratio between the input sample rate and the output sample rate.

In certain audio processing applications, the variation in the pitch of the sound may be known in advance. The audio signal may be processed using a single filter or multiple filters. When the variation in the pitch is known, a sample rate converter may interpolate between the two filters based on the known pitch range. As an example, a single bit may be used to select automatically between the two filters. In other audio processing applications, however, there may be no or little advance notice of the pitch. As an example, in a gaming environment, the game software working with the game console may set a certain pitch when the sound is started (e.g., the sound corresponding to the engine of a car in a car racing game). The pitch, however, may vary dramatically during the race as the car accelerates or decelerates throughout the race. Interpolating between multiple filters may help with the quality of the sound. However, because of the suddenness of the variation of the pitch, other problems may still be there. As an example, noise spikes may occur. Thus, additional changes to the sample rate converter may be required to address such issues.

In one example, a multi-stage topology may be used for the sample rate conversion. Taking advantage of the properties of the multi-stage topology, good quality sound may be provided for the entire supported pitch range. This may be accomplished by using the software to select the correct filter and constrain the run-time for an audio stream to stay within the pitch boundaries for the selected filter.

Figure 1:
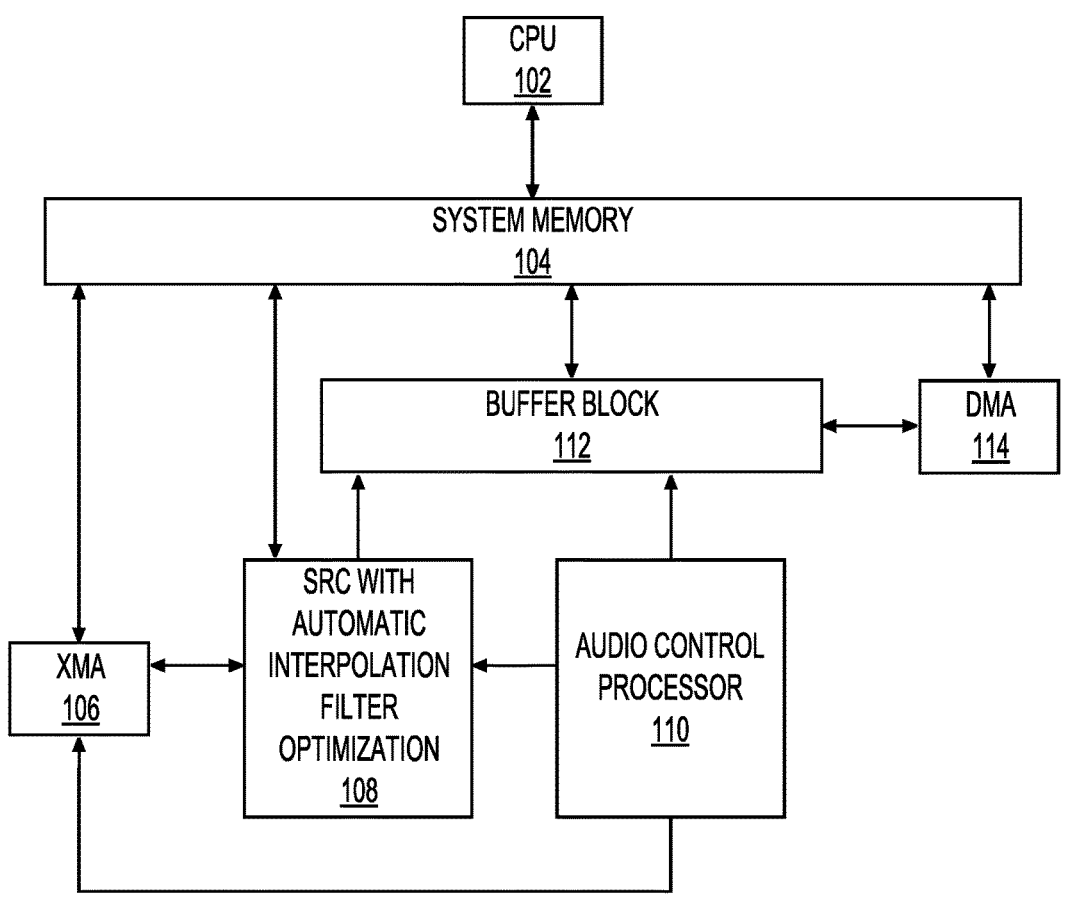
FIG. 1 shows a diagram of an audio processing environment, including a sample rate converter (SRC) with automatic interpolation filter optimization in accordance with one example.

FIG. 1 shows an audio processing environment 100 (e.g., in a game console or another device) in accordance with one example. Audio processing environment 100 may include a CPU 102, a system memory 104, an XMA decoder block 106, a sample rate conversion (SRC) block with automatic interpolation filter optimization 108, and audio control processor 110, a buffer block 112, and a direct memory access (DMA) block 114. In one example, compressed audio data (e.g., XMA data) is stored in system memory 104 and it is processed by an XMA decoder block 106. XMA data may correspond to data that is compressed using a variable bit-rate compression technique. The XMA decoder block 106 may decode a portion of the stored XMA data and return the decoded data (e.g., PCM samples) to the system memory 104, e.g., into an XMA decode buffer. When directed by an audio control processor 110, the SRC block with automatic interpolation filter optimization 108 may read (e.g., via its own memory interface) the PCM samples from the XMA decode buffer and perform sample rate conversion related functions. This may allow audio data of an arbitrary sampling rate to be brought into the sound processing environment's accelerator blocks. In one implementation, upon processing, the audio data may run at a fixed sampling rate of 48 kHz and the processed data may be output to buffer block 112.

Additional processing may be performed by other hardware blocks that operate on the data, including reading from buffer block 112 and writing to buffer block 112. CPU 102 may provide additional audio processing with digital signal processing (DSP). DMA block 114 may transport data between the buffer block 112 and system memory 104. In this example, when sample rate conversion is required, audio control processor 110 may receive a suitable (e.g., SRC) command from CPU 102. Although FIG. 1 shows certain components of audio processing environment 100 that are arranged in a certain manner, audio processing environment 100 may include additional or fewer elements that may be arranged differently. As an example, instead of storing compressed audio data as XMA data, the compressed audio data may be stored in a different format, such as Opus/Vorbis format. In this implementation, XMA decoder block 106 may be replaced by an Opus decoder block. In such an implementation, the Opus decoder block may be directly coupled to buffer block 112 and not coupled to system memory 104. In addition, in such an implementation, SRC block 108 may not be coupled to system memory 104. In this example, only DMA 114 may be coupled to system memory 104. Thus, in this example, compressed audio data (e.g., Opus data) is stored in system memory 104 and it is processed by the Opus decoder block. Opus data may correspond to data that is compressed using a variable bit-rate compression technique. The Opus decoder block may decode a portion of the stored Opus data and store the decoded data (e.g., PCM samples) to the buffer block 112, e.g., into an Opus decode buffer. When directed by an audio control processor 110, the SRC block with automatic interpolation filter optimization 108 may read (e.g., via its own memory interface) the PCM samples from the Opus decode buffer and perform sample rate conversion related functions.

Figure 2:
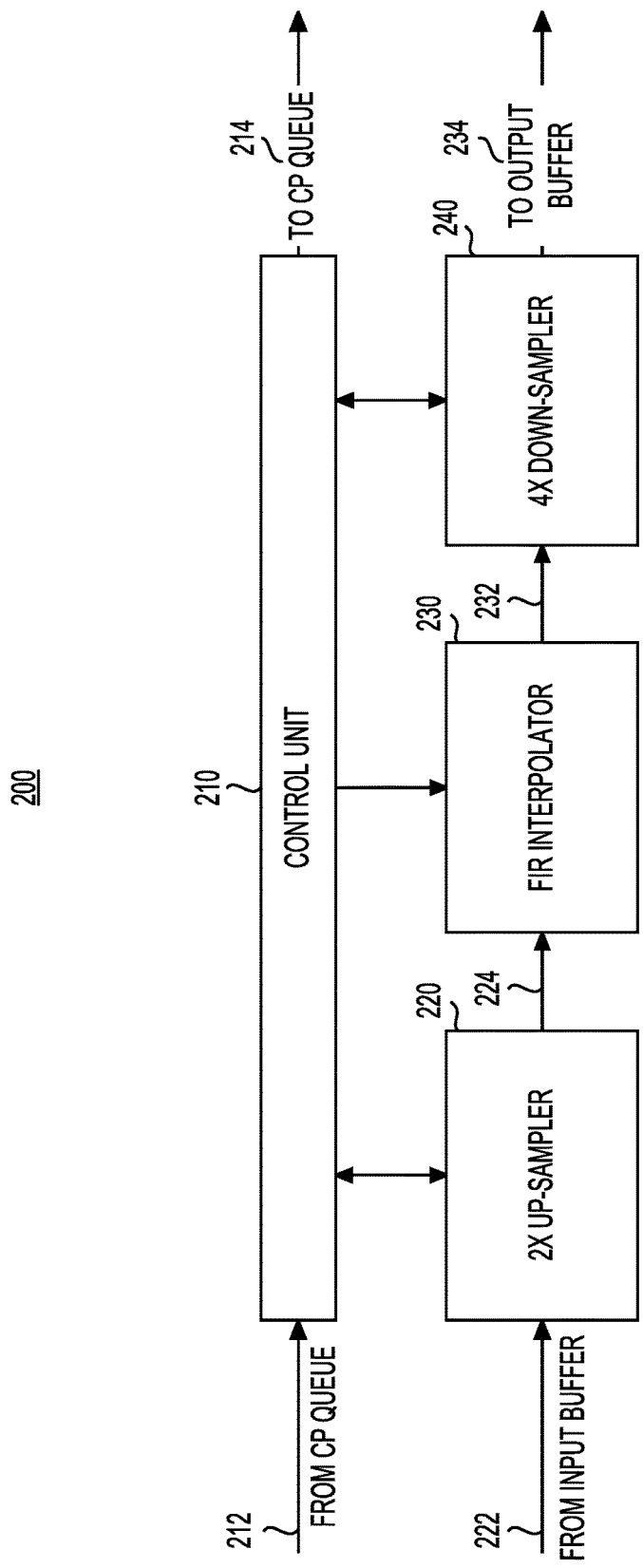
FIG. 2 shows a diagram of a three-stage sample rate converter (SRC) in accordance with one example.

FIG. 2 shows a diagram of a three-stage sample rate converter (SRC) 200 in accordance with one example. SRC 200 may include a control unit 210, an upsampler 220, an interpolator 230, and a downsampler 240. Control unit 210 may receive commands and control blocks from a Command Processor Queue (e.g., CP Queue 212), provide necessary parameters and state information to the other blocks, update parameters and state information as needed, and send completion and updated state information to the Command Processor Queue (e.g., CP Queue 214). Control Unit 210 may provide the interface between the audio control processor's decode queues and the logic blocks that process the samples (e.g., in the form of packets) received from the decode queues. The packets may contain a pointer (or some other reference) to context data, enabling the hardware corresponding to SRC 200 to access the decoded audio in on-chip memory, and write back the converted audio to on-chip memory. Table 1 below shows an example of the packet format for SRC 200.

TABLE 1

| Packet Field | Description |
| --- | --- |
| cmdID | Programmable ID that may be passed by SRC 200 to the output to allow audio processing software to keep track of the processing. |
| pContext | Pointer to the SRC context data structure |
| pDecodeBuffer | Pointer to a buffer for storing the decoded samples that are input to SRC 200 |
| pOutputBuffer | Pointer to a buffer for storing the sample-rate converted samples |

The pointers in Table 1 may refer to buffers that are part of an on-chip SRAM corresponding to a System-on-Chip (SoC) device that includes SRC 200. Although Table 1 shows a certain number of fields organized in a certain way, Table 1 may include additional or fewer fields organized differently. In addition, the information stored in Table 1 may be obtained via special instructions or other methods. Table 2 below shows an example of the context data for SRC 200.

TABLE 2

| SRC field | Description |
| --- | --- |
| currentAddr | Fractional read address may be used to access the Input Buffer. The fractional read address may comprise 4 bits of unsigned integer offset address, and 17 bits of fractional interpolation address. |
| currentPitch | This may be the ratio of the Input Sample Rate to the Output Sample Rate:<br>currentPitch = InRate/OutRate<br>In this example, this may be the amount by which the currentAddr increments after each individual output sample:<br>currentAddr[n + 1] = currentAddr[n] + currentPitch<br>This value may be a fixed-point value with 3 unsigned integer bits and 18 fractional bits for a total of 21 bits. |
| interpFilt | In this example, two bits may be used to select between the two FIR filter coefficient tables (described later), as follows:<br>0   Automatic Interpolation Mode<br>1   Filter 1 - Wide Range<br>2   Filter 2 - Higher Quality |

Although Table 2 shows a certain number of fields organized in a certain way, Table 2 may include additional or fewer fields organized differently. In addition, the information stored in Table 2 may be obtained via special instructions or other methods.

Control unit 210 may disable blocks that process the samples when there are no more items in the incoming queue. Control unit 210 may be configured to keep audio processing blocks busy. To minimize context switch overhead, control unit 210 may prefetch the context data for the next packet in the queue.

Upsampler 220 may upsample the input stream, received via input bus 222, by a factor (e.g., a factor of 2x) and provide that as input to interpolator 230 via bus 224. Upsampler 220 may also receive state (e.g., Z-buffers), provide updated state from/to control unit 210, and read decoded audio samples from the decoder memory (e.g., the decoder SRAM). In one example, upsampler 220 may use a power-symmetric quadrature mirror filter (QMF) structure.

Interpolator 230 may perform multiple interpolations (described further later) on samples, received via bus 224, and in one example operate at 4x the output sample rate. In one example, interpolator 230 may be implemented as a finite impulse response (FIR) filter. The interpolation function may be performed in the time domain using convolution. Assuming eight input samples, the output of the convolution may be the weighted sum of the input samples and thus may be computed using equation 1: $y_n = \Sigma_{m=0}^{7} b_m x_{n-m}$ The weights, $b_m$, may be the selected coefficients from the FIR filter. In this example, the filter may be designed as a 4096-point FIR, and only eight of the coefficients may be selected to perform the weighted sum. In this example, this can be done because the sampled input signal is upsampled, e.g., by zero-insertion, as described earlier. Since the zero-inserted samples have no effect on the output of the FIR filter, the multiply-accumulate operations that have zero-valued samples may be skipped (e.g., those for which $x_n = 0.0$).

Downsampler 240 may down-sample the output of the interpolator, received via bus 232, from 4x to the final output sample rate. Downsampler 240 may further receive state (e.g., Z-buffers) and provide updated state from/to the control unit, and store re-sampled audio samples into the decoder SRAM via output buffer 234. In this example, a decode flow processor (not shown) may insert packets into the SRC 200 incoming queue to command SRC 200 to perform a conversion. Although FIG. 2 shows a certain number of components of SRC 200 arranged in a certain manner, there could be more or fewer number of components arranged differently. In one example, the functionality corresponding to the interpolator, the upsampler, and the downsampler may be implemented using logic gates and state machines as part of hardware in a system on a chip (SoC). Alternatively, or additionally, some portions may be implemented as part of software.

Figure 3:
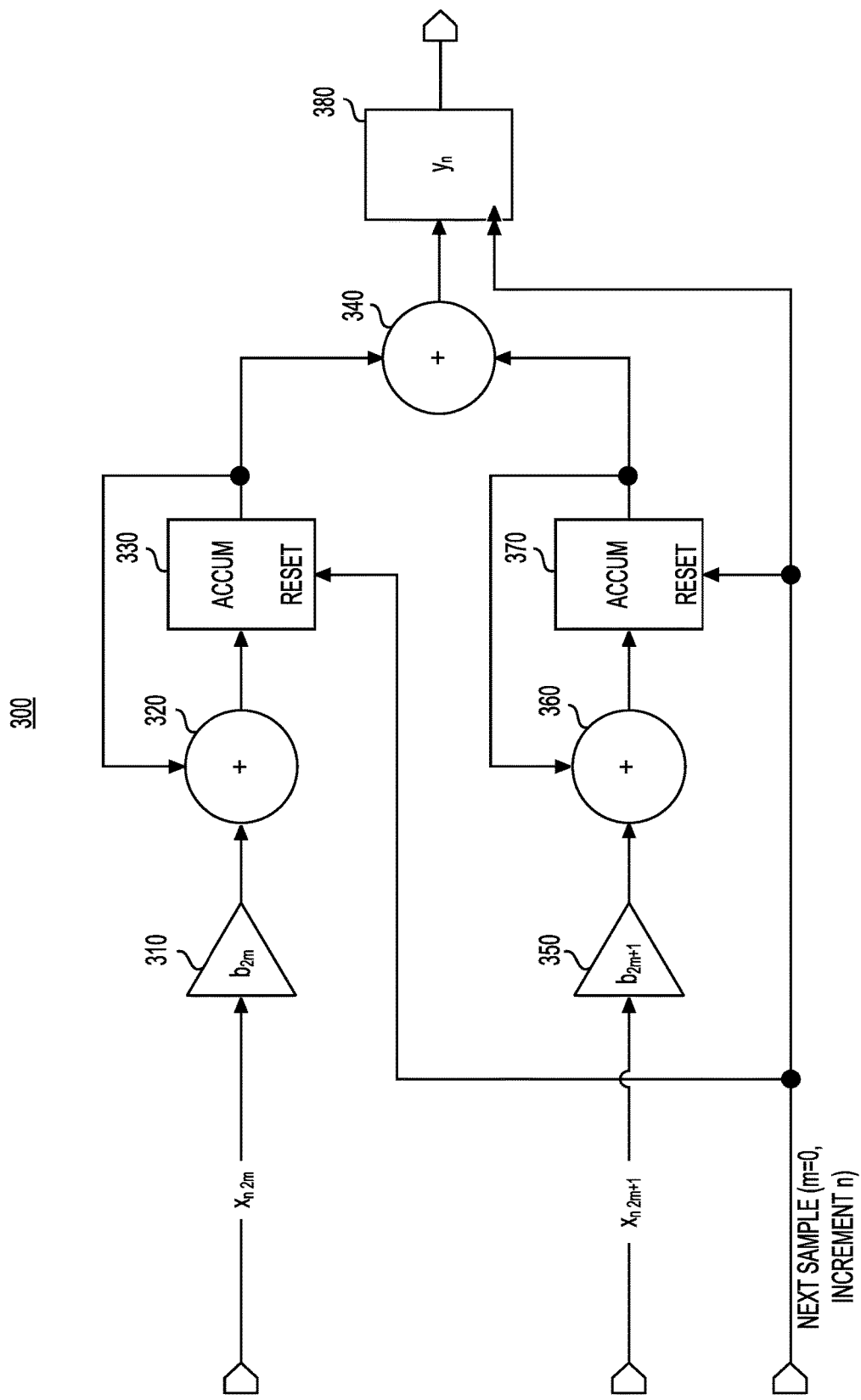
FIG. 3 shows a diagram of a dual data-path interpolator in accordance with one example.

Referring now to FIG. 3, in one example, interpolator 230 may be implemented as a dual data-path interpolator 300. This may allow the interpolation operation to be performed in parallel. The convolution operation provided in equation 1 may be split into two summations as shown in equation 2: $y_n = \Sigma_{m=0}^{3} b_{2m} X_{n-2m} + \Sigma_{m=0}^{3} b_{2m+1} X_{n-2m-1}$. Thus, the upper path including buffer $b_{2m}$, summer 320, and accumulator 330 may be used to process even samples and the lower path including buffer $b_{2m+1}$, summer 360, and accumulator 370 may be used to process odd samples. The accumulated results may be summed using summer 340 and output via output buffer 380. In this example, in each path two distinct interpolations may be performed, one based on the phase and the other based on pitch. In this example, "phase" may refer to the relative position of the current output sample to the input sample stream. This position can be "in-between" samples such that the phase needs to have a fractional component. In this example, the phase is a sample address, but it can be used to address in-between samples.

The selection of the coefficients may be performed by using a fractional address, which is referred to as the CurrentAddr (see Table 2) in this example. As part of interpolating between input samples, the pointer to the input samples may have a fractional value; thus, it has both an integer portion and a fractional portion. In this example, the integer portion of the pointer determines the memory locations from which to read the samples, and the fractional portion determines the coefficients used for interpolation between the samples. One possible format for the integer and interpolation fraction is shown in Table 3 below.

TABLE 3

| currentAddr.integer | 4 bits | Offset into the interpolator input buffer |
| currentAddr.fraction | 19 bits | Fractional phase between samples |

In this example, the user-facing pitch may have 18 fractional bits and 3 integer bits. However, this is equivalent because the user-facing pitch is relative to the input sample rate and in this example, the interpolator operates at twice the rate of the input sample rate. Although FIG. 3 shows a certain number of components of dual data-path interpolator 300 arranged in a certain manner, there could be more or fewer number of components arranged differently.

Figure 4:
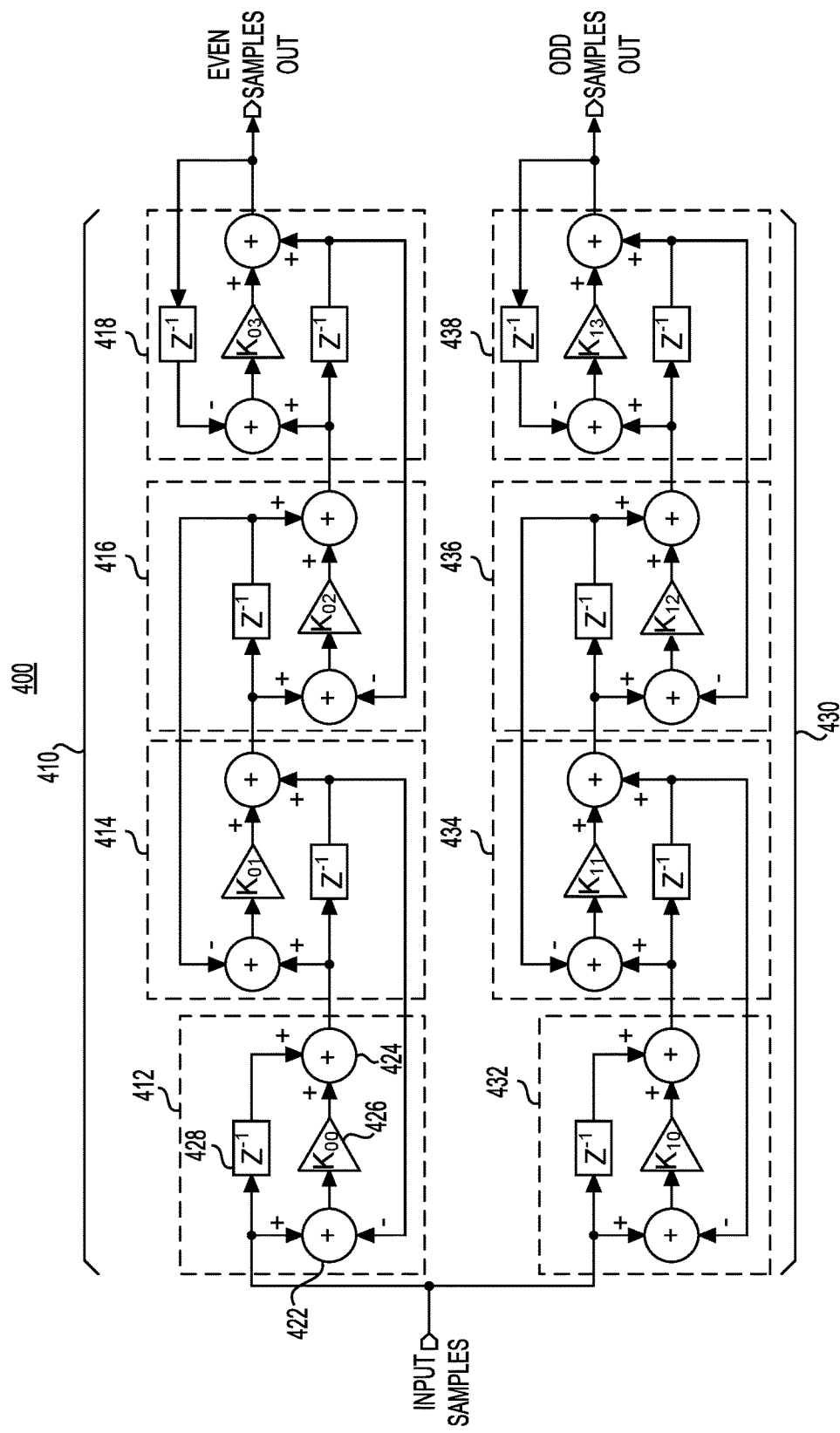
FIG. 4 shows a block diagram of an upsampler in accordance with one example.

FIG. 4 shows a block diagram of an upsampler 400 in accordance with one example. In this example, the upsampler 400 may be implemented using a Power-Symmetric Quadrature Mirror Filter (QMF) structure in the reconstruction form. This structure may include two chains of all-pass filters, with the poles and zeros arranged such that the group delay between the two chains is 0.5 samples relative to the input sample rate at most frequencies. The outputs of the two chains may be processed separately, and by alternating between them a new stream with double the number of samples may be created. This is because, in this example, the group delay between the chains is one-half sample period. In this example, upsampler 400 may include two chains of all-pass filters with four all-pass filters in each chain. Thus, as shown in FIG. 4, upsampler 400 may include a first chain 410 configured to process even samples and a second chain 430 configured to process odd samples. In this example, chain 410 may include four all-pass filters (412, 414, 416, and 418) and chain 430 may also include four all-pass filters (432, 434, 436, and 438). Each of the all-pass filters may include similar components. As an example, all-pass filter 412 may include two adders (422 and 424), a multiply element 426, and a delay element 428. In this example, the triangle shape with a K in the middle indicates a multiply by the value K, which is the coefficient for a particular section. In this example, the rectangles with $Z^{-1}$ inside indicate a delay of one sample period. Adder 422 and other adders have a minus sign indicating a subtraction operation. As shown in FIG. 4, in this configuration of upsampler 400, cascaded all-pass filters 414 and 416 share a delay element and similarly cascaded all-pass filters 434 and 436 share a delay element. Although FIG. 4 shows a certain number of components of upsampler 400 arranged in a certain manner, there could be more or fewer number of components arranged differently.

Figure 5:
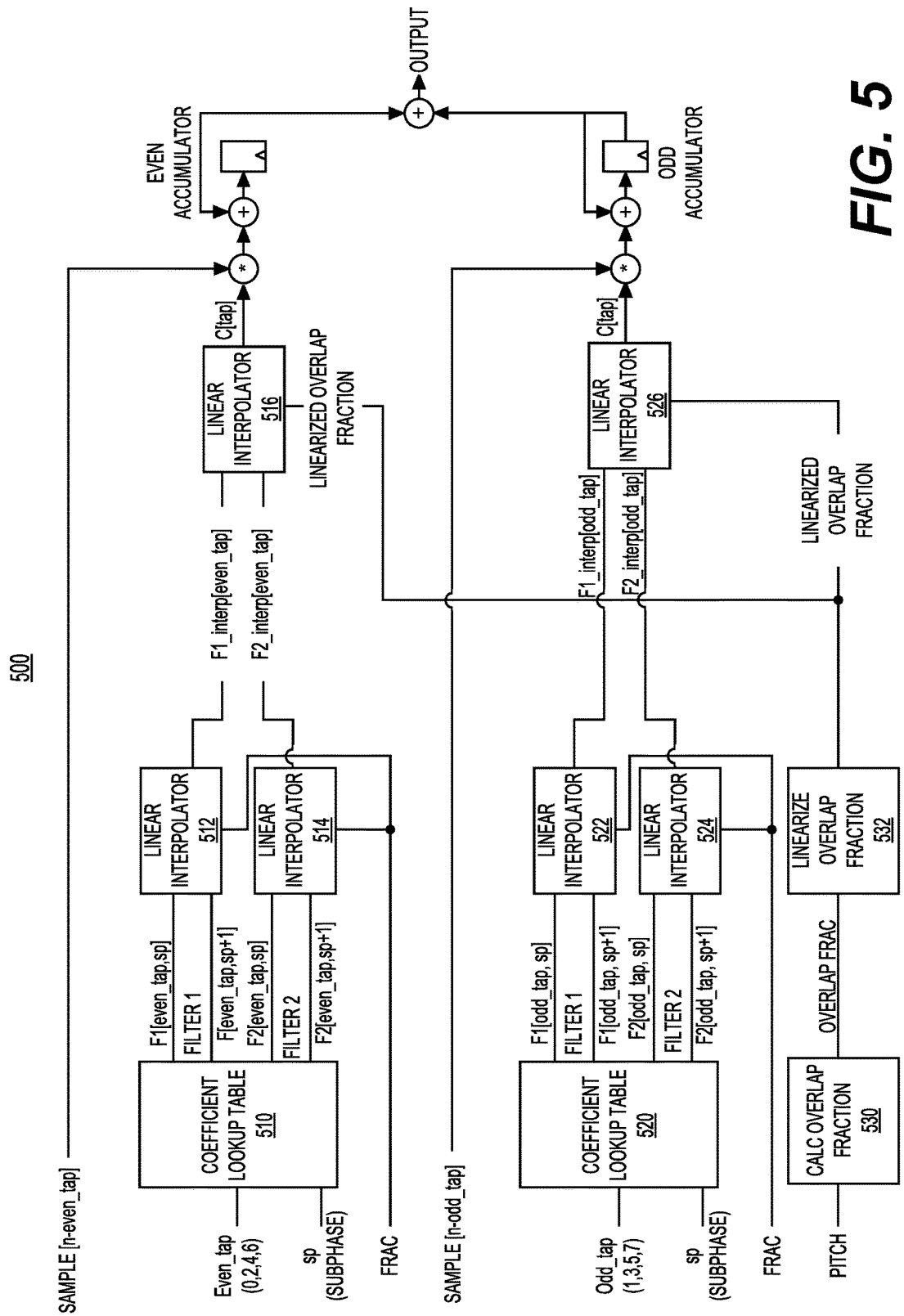
FIG. 5 shows a block diagram of a sample rate converter (SRC) in accordance with one example.

FIG. 5 shows a block diagram of a sample rate converter (SRC) 500 in accordance with one example. SRC 500 may be configured to process even samples and odd samples in parallel. Thus, in this example, the interpolation operations may be performed in a manner as described with respect to FIG. 2 and FIG. 3. In this example, to achieve completion in four clock cycles, in one implementation, SRC 500 may instantiate two parallel units, one of which operates on the even-numbered taps, and the other on the odd-numbered taps. SRC 500 may receive its input from upsampler (e.g., upsampler 400 of FIG. 4) including even samples and odd samples. SRC 500 may include similar components for processing each of the odd samples and even samples. Coefficient values corresponding to the even and odd samples may be stored in different lookup tables. As an example, coefficient values corresponding to even samples may be stored in coefficient lookup table 510 and coefficient values corresponding to odd values may be stored in coefficient lookup table 520. In this example, each filter may have 512 subphases and thus there may be a need to select from 512 sets of coefficients where each set may be considered to be a single subphase. Table 4 shows one example of a data structure that may be used to specify the subphase and a linear interpolation fraction.

TABLE 4

| currentAddr | | |
|---|---|---|
| 31 30 29 28 27 26 25 24 23 22 21 20 | 19 18 17 16 15 14 13 12 11 10 9 8 7 6 5 4 3 2 1 0 | |
| Integer | Fraction | |
| | subphase | interpFrac |

As described earlier, the input to the interpolator block is from the upsampler, and because there are two samples in the interpolator input buffer for every sample in the main memory (e.g., system memory 104 of FIG. 1), certain bits of the Integer field may be used to address samples stored in the main memory. The bits corresponding to the subphase field may be used to select which of the 512 subphases are used for the convolution operation. The bits corresponding to the interpFrac field may be used as a linear interpolation fraction. In this example, the linear interpolation algorithm may be configured to interpolate between adjacent subphases within the coefficient lookup tables. Thus, the subphase field referred to above may select between two subphases to be read. Thus, in this example, the coefficients that are delivered to the convolution are the result of this linear interpolation operation. Mathematically, in this example, the linear interpolation may be performed using Equation 3 as follows: $b_m = C_{128m+subPhase} + \text{interpFrac} \cdot (C_{128m+subPhase+1} - C_{128m+subPhase})$. In this example, interpolator may operate at four times the output sample rate (e.g., 192 kHz), which enables a maximum pitch of 8.0. The interpolators may perform 4 convolutions, generating 4 samples, which are fed to the downsampler stage for final conversion to the output rate.

Figure 6:
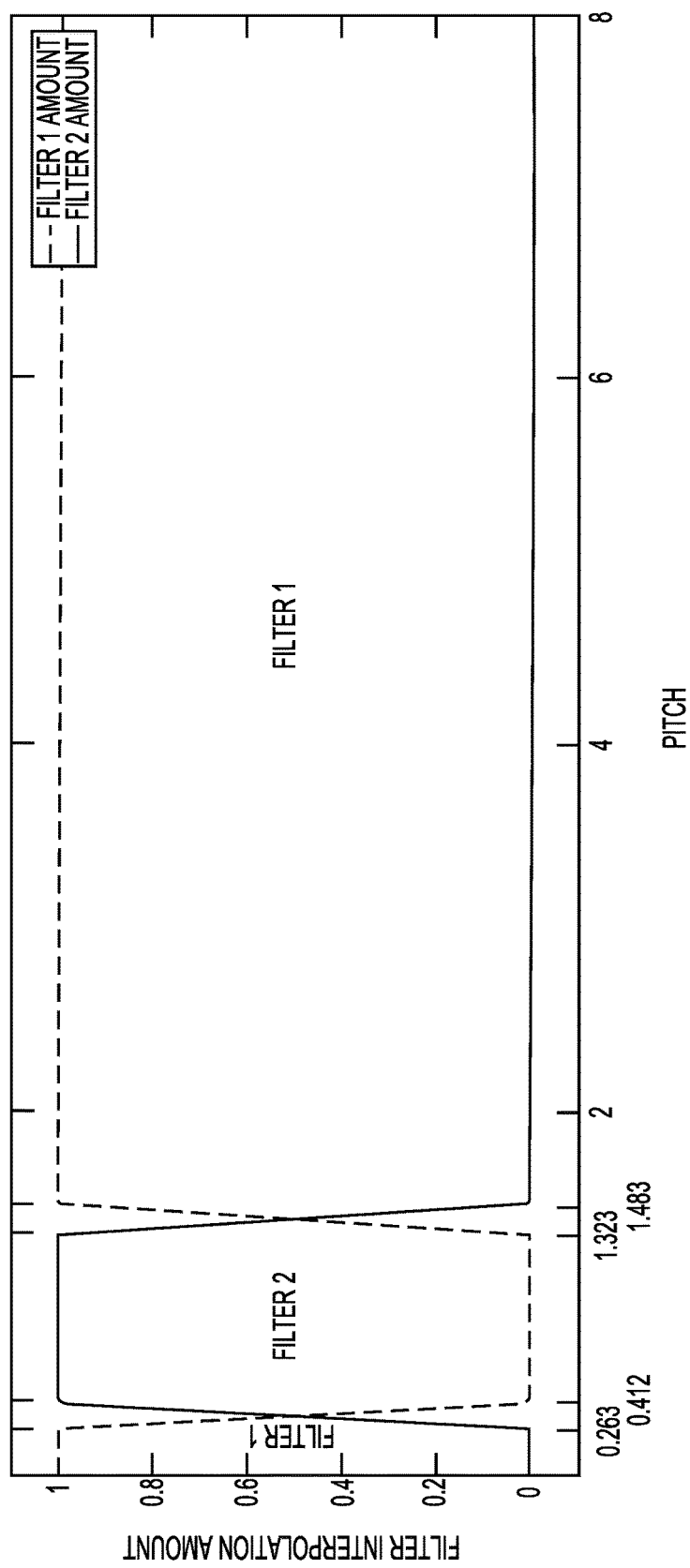
FIG. 6 shows different filter interpolation amounts for Filter 1 and Filter 2 based on an example pitch range.

As an example, FIG. 6 shows different filter interpolation amounts for Filter 1 and Filter 2 based on an example pitch range. With continued reference to FIG. 5, SRC 500 may perform automatic filter selection between Filter 1 and Filter 2 based on a current pitch of the sample. As an example, the currentPitch field value (e.g., as shown in Table 2) may be obtained by SRC 500 to interpolate between Filter 1 and Filter 2. In one example, the pitch may be based on a relationship between an input sampling rate of a first audio signal to an output sampling rate of a second audio signal. The first audio signal may be the signal input to an interpolator and the second audio signal may be the signal output by the interpolator. In this example, SRC 500 may use Filter 1 when the current pitch is less than 0.263 and is greater than 1.483. Filter 2 may be used when the current pitch is greater than 0.412 and less than 1.323. SRC 500 may interpolate between Filter 1 and Filter 2 when the current pitch is in either of two ranges: 0.263 to 0.412 and 1.323 and 1.483. The overlap fraction (OVERLAP FRAC of FIG. 5) may be calculated using the block labeled as CALC OVERLAP FRACTION 530. In one example, the overlap fraction (referred to as overlapFrac in the pseudocode) may be calculated using the pseudocode shown in Table 5; the pseudocode or similar code may be implemented as a logic block in hardware or implemented as a set of instructions for execution by a processor.

TABLE 5

MIN_RANGE_LO=20/76;
MIN_RANGE_HI=28/68;
MIN_RANGE_RECIP_DIFF=(76*68) / (76*28 − 68*20);
MAX_RANGE_LO=164/124;
MAX_RANGE_HI=172/116;
MAX_RANGE_RECIP_DIFF=(124*116) / (124*172 − 116*164);
if (interpFilt==1) // select wide range filter
    overlapFrac=0.0;
elseif (interpFilt==2) // select highest quality filter
    overlapFrac=1.0;
elseif (currPitch < MIN_RANGE_LO) //
(interpFilt==0)
    overlapFrac=0.0;
elseif (currPitch < MIN_RANGE_HI)
    overlapFrac=(currPitch−
MIN_RANGE_LO)*MIN_RANGE_RECIP_DIFF;
elseif (currPitch < MAX_RANGE_LO)
    overlapFrac=1.0;
elseif (currPitch < MAX_RANGE_HI)
    overlapFrac=1.0 − (currPitch−
MAX_RANGE_LO)*MAX_RANGE_RECIP_DIFF;
else
    overlapFrac=0.0;
end The pseudocode shown in Table 6 assumes a certain filter design and certain relationship between the output sampling rate and input sampling rate. In this example, the output sampling rate is four times (4×) the input sampling rate, and thus the interpolator is operating at 192 kHz when the input sample rate is 48 kHz. Thus, in this example, the numbers shown in Table 6 corresponding to minimum and maximum range represent the frequency in kHz based on the aforementioned sampling rates. As an example, the MAX_RANGE_HIGH is shown as 172/116 is based on the calculations for the interpolation range. The numerator 172 kHz corresponds to 192 kHz minus 20 kHz and the denominator 116 corresponds to 96 kHz plus 20 kHz. Other filter design constraints and operating sampling rates may result in different numbers in the pseudocode shown in Table 6.

In this example, Filter 1 may be selected to support the full pitch range of −4 octaves to +3 octaves, but the audio quality may be limited such that in some scenarios for certain combinations of frequency content and pitch, the signal-to-noise ratio (SNR) may be as low as 100 dB. As part of the Filter 1 design, it may be assumed that all images of the input passband can potentially produce aliases into the output passband. Input images starting at 76 kHz may alias into the audio passband from 0-20 kHz, so, in this example, the filter is constrained to have a stopband starting at 76 kHz. Filter 1 may smoothly transition from 0 dB to less than −120 dB starting from 20 kHz up to 76 kHz. From the perspective of filter design constraints, this transition region may be considered a band that is not relevant because, in this example, the upsampler is configured to remove signal components between 28 kHz and 68 kHz, and both the region from 20-28 kHz and its conjugate frequency region 68-76 kHz at Fs=96 kHz represent inaudible ranges of human hearing.

In one example, automatic interpolation between Filter 1 and Filter 2 may be performed by the logic associated with SRC 500. In this example, SRC 500 may interpolate between the two filters when interpFilt bit (Table 2) is set to a certain value (e.g., 0).

Figure 7:
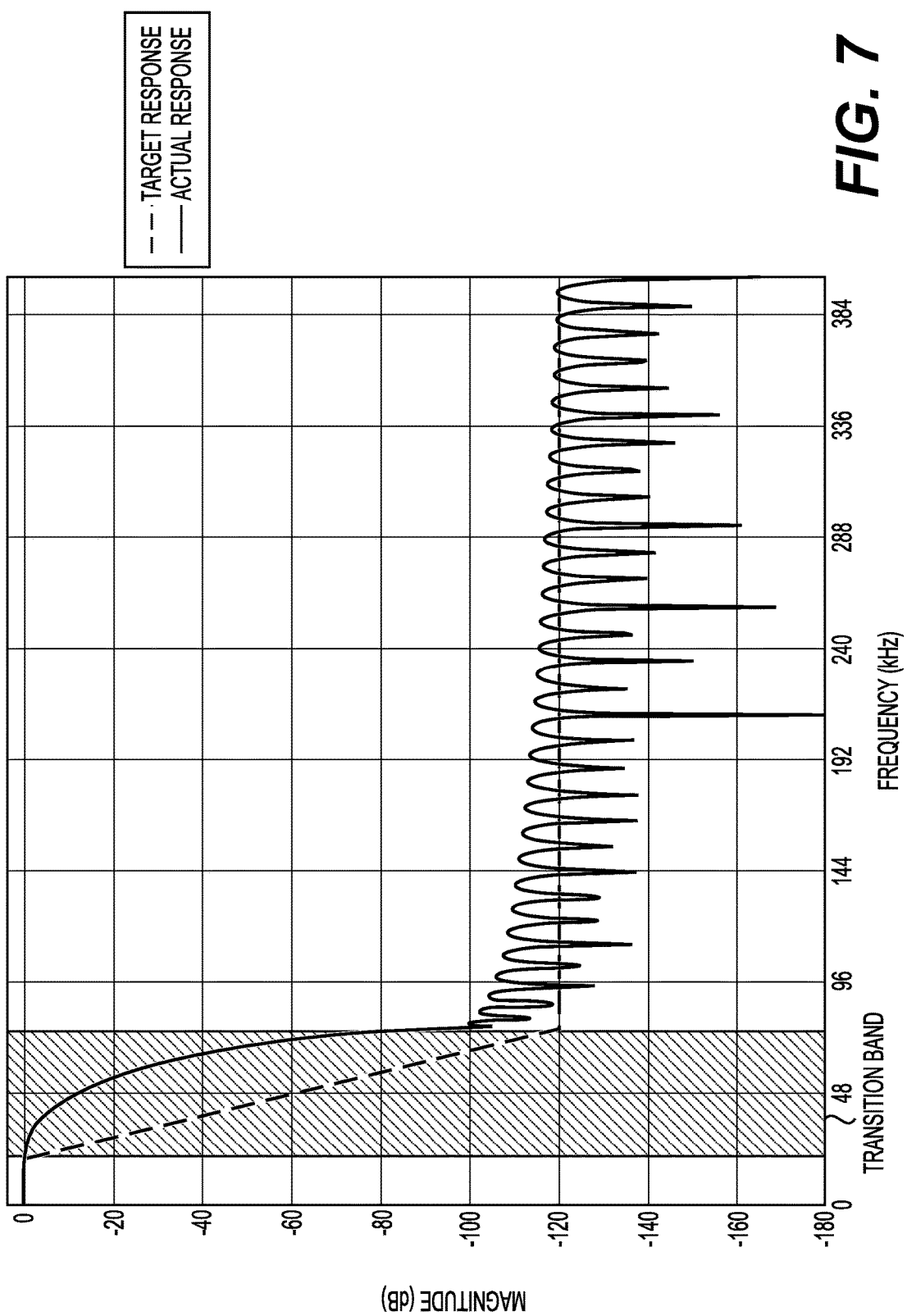
FIG. 7 shows the target and the actual frequency response for the example Filter 1.

FIG. 7 shows the target and the actual frequency response for the example Filter 1. The overall filter response extends up to 24.576 MHz. There may be a small region of concern at exactly F=96 kHz. Because the effect of this topology is to further upsample the input signal by zero-insertion, any DC component in the input becomes a pulse train at F=96 kHz. Thus, in this example, the spectrum has a strong component at 96 kHz. If this is not filtered out, a DC input may result in a pitch-shifted waveform that traces out the shape of the impulse response of the filter. This effect may be quite significant. A solution to this issue may be to create a deep zero at 96 kHz in the filter response.

Figure 8:
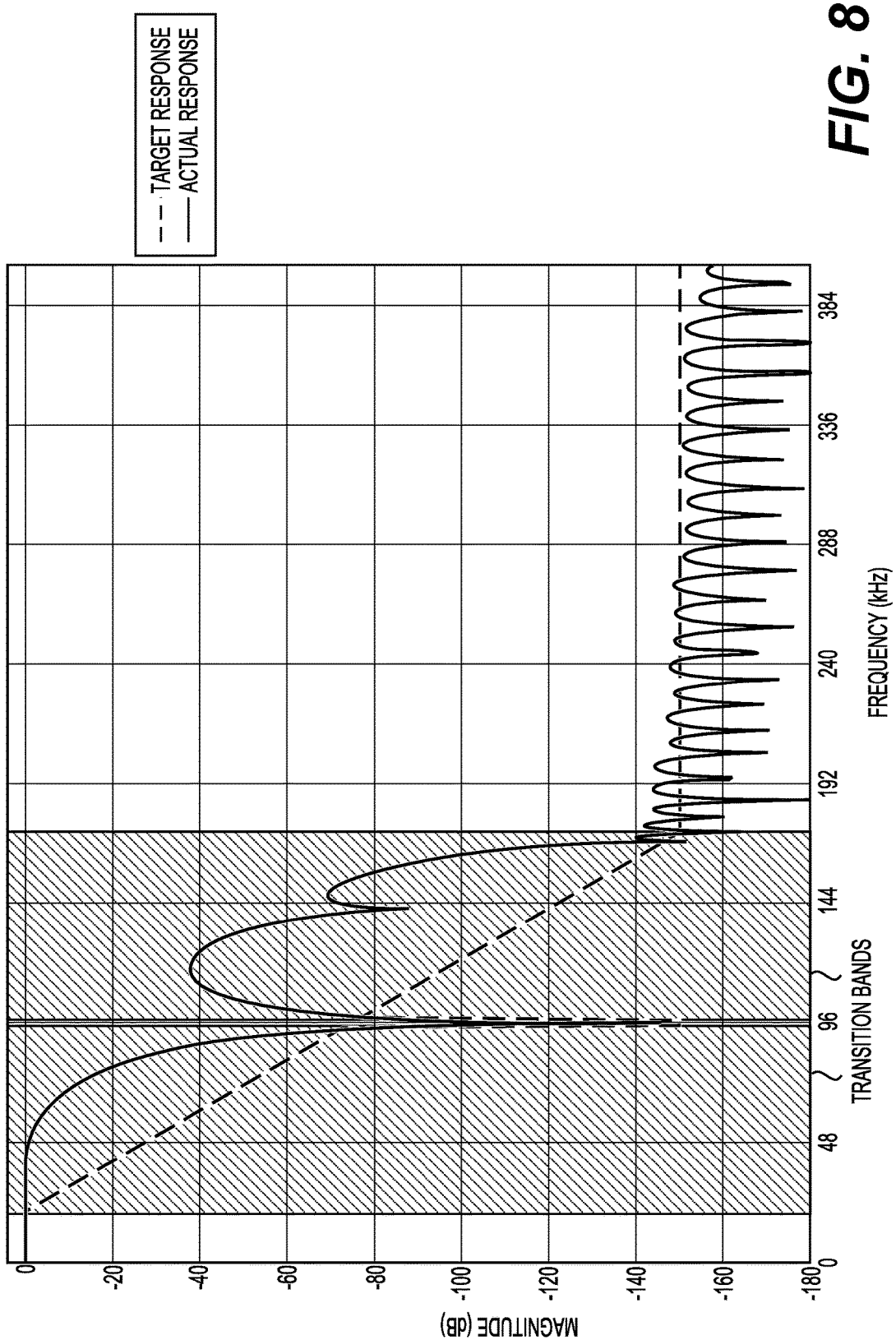
FIG. 8 shows the target and the actual frequency response for the example Filter 2.

FIG. 8 shows the frequency response of Filter 2. As shown in this figure, as the frequency increases, the filter stopband goes below approximately −150 dB. As in Filter 1, the overall filter response extends up to 24.576 MHz since there are 512 subphases resulting in a 49.152 MHz sampling rate. As the frequency increases, the filter stopband steadily becomes deeper, dropping below −150 dB at about 275 kHz and for the most part below −160 dB around 3 MHz. Thus, in this example, primary contributions to potential aliasing may come from the first image outside the frequency region that is not considered relevant to the filter design; for example, the band from 172-212 kHz. Moreover, in this example even these components may be below −140 dB, which results in an overall SNR that is better than 120 dB in almost all cases.

In one example, the calculated overlap fraction may be linearized using the block labeled LINEARIZE OVERLAP FRACTION 532. This process may be performed using hardware logic or a combination of hardware and software. In one example, a lookup table may be used to linearize the calculated overlap fraction. An example lookup table may include values corresponding to the linearized overlap fraction for a subset of the values corresponding to the overlap fraction. Table 7 below is an example of a lookup table. The table may have 64 rows, where each row represents an increment of $\frac{1}{64}$ To the overlap fraction value over the overlap fraction value in the predecessor row. For illustration purposes, the table below shows every fourth entry from the table having such rows. Thus, the second row indexed by the number 3 represents the fourth row of the lookup table and the overlap fraction value is $\frac{3}{64}$=0.46875).

TABLE 6

| Index | Overlap Fraction | Mapped Value | MS 6-bits | Output |
|---|---|---|---|---|
| 0 | 0.000000 | 0.0000000000000000 | 6'h00 | 16'h0000 |
| 3 | 0.046875 | 0.0001220703125000 | 6'h03 | 16'h0008 |
| 7 | 0.109375 | 0.0003509521484375 | 6'h07 | 16'h0017 |
| 11 | 0.171875 | 0.0007476806640625 | 6'h10B | 16'h0031 |
| 15 | 0.234375 | 0.0014190673828125 | 6'h0F | 16'h005D |

TABLE 6-continued

| Index | Overlap Fraction | Mapped Value | MS 6-bits | Output |
|---|---|---|---|---|
| 19 | 0.296875 | 0.0025482177734375 | 6'h13 | 16'h00A7 |
| 23 | 0.359375 | 0.0044555664062500 | 6'h17 | 16'h0124 |
| 27 | 0.421875 | 0.0076599121093750 | 6'h1B | 16'h01F6 |
| 31 | 0.484375 | 0.0130920410156250 | 6'h1F | 16'h035A |
| 35 | 0.546875 | 0.0222473144531250 | 6'h23 | 16'h05B2 |
| 39 | 0.609375 | 0.0377044677734375 | 6'h27 | 16'h09A7 |
| 43 | 0.671875 | 0.0637969970703125 | 6'h2B | 16'h1055 |
| 47 | 0.734375 | 0.1078491210937500 | 6'h2F | 16'h1B9C |
| 51 | 0.796875 | 0.1822204589843750 | 6'h33 | 16'h2EA6 |
| 55 | 0.859375 | 0.3077392578125000 | 6'h37 | 16'h4EC8 |
| 59 | 0.921875 | 0.5196228027343750 | 6'h3B | 16'h8506 |
| 63 | 0.984375 | 0.8772888183593750 | 6'h3F | 16'hE096 |

Although this example uses 64 step increases or breakpoints and thus the interpolation fraction uses six bits, a higher number of step increases or a lower number of step increases may be used. As an example, twelve bits, sixteen bits, or a higher number of bits may be used. Moreover, the lookup table may be generated using different approaches. In one example, a fraction linearization curve may be calculated by measuring the response of the filter interpolation at 83.25 kHz using 65,536 uniformly distributed fraction values, effectively a 16-bit fraction. In this example, 64 target response values are calculated to be uniformly distributed across the difference between Filters 1 and 2 at a selected frequency (e.g., 83.25 kHz), and selecting the fraction values that result in an interpolated response that is closest to each target value. The resulting 64 fraction values may be used as part of the lookup table. The linearized fraction values may be used to perform additional interpolation operations. Although the use of a lookup table is described to perform interpolation operations, other techniques, including analog processing techniques may also be used. As an example, instead of the lookup table, a hardware representation of a relationship (e.g., an algebraic relationship) between interpolation steps and filter response may be used. This may include the use of Z transforms of the filters.

Linear interpolator 516 may be used to interpolate between the even interpolated coefficient values for Filter 1 and Filter 2. Similarly, in a parallel data path, linear interpolator 526 may be used to interpolate between the odd interpolated coefficient values for Filter 1 and Filter 2. These interpolation operations may include using the values corresponding to the MS 6—bits of the calculated overlap linear fraction, and linearly interpolating between the two adjacent values using the remaining LS bits. For example, to calculate the linearization fraction for a fraction value of 0.0234375, which is 18'h01800, the fraction may be separated into the most significant bits (MSBs)=6'h01 and the least significant bits (LSBs)=12'h800. Next, the hardware logic (or software) may look up entries 1 and 2 in the table (because the MSBs=1), and linearly interpolate between them using the LSBs resulting in a value of 18'h00010 (0.00006103515625).

The outputs generated by the respective interpolators may be accumulated using accumulators, such as the EVEN ACCUMULATOR and the ODD ACCUMULATOR shown in FIG. 5. To avoid saturation, the accumulators may be configured to have sufficient headroom to accommodate the full range of coefficient values being accumulated.

Although FIG. 5 shows SRC 500 configured in a certain manner, SRC 500 may be implemented in other ways. As an example, in FIG. 5, although SRC 500 is configured to perform the phase-based interpolation first, followed by the pitch-based interpolation, SRC 500 may be configured to perform the interpolations in the opposite order (e.g., first performing pitch-based interpolation, followed by the phase-based interpolation).

Figure 9:
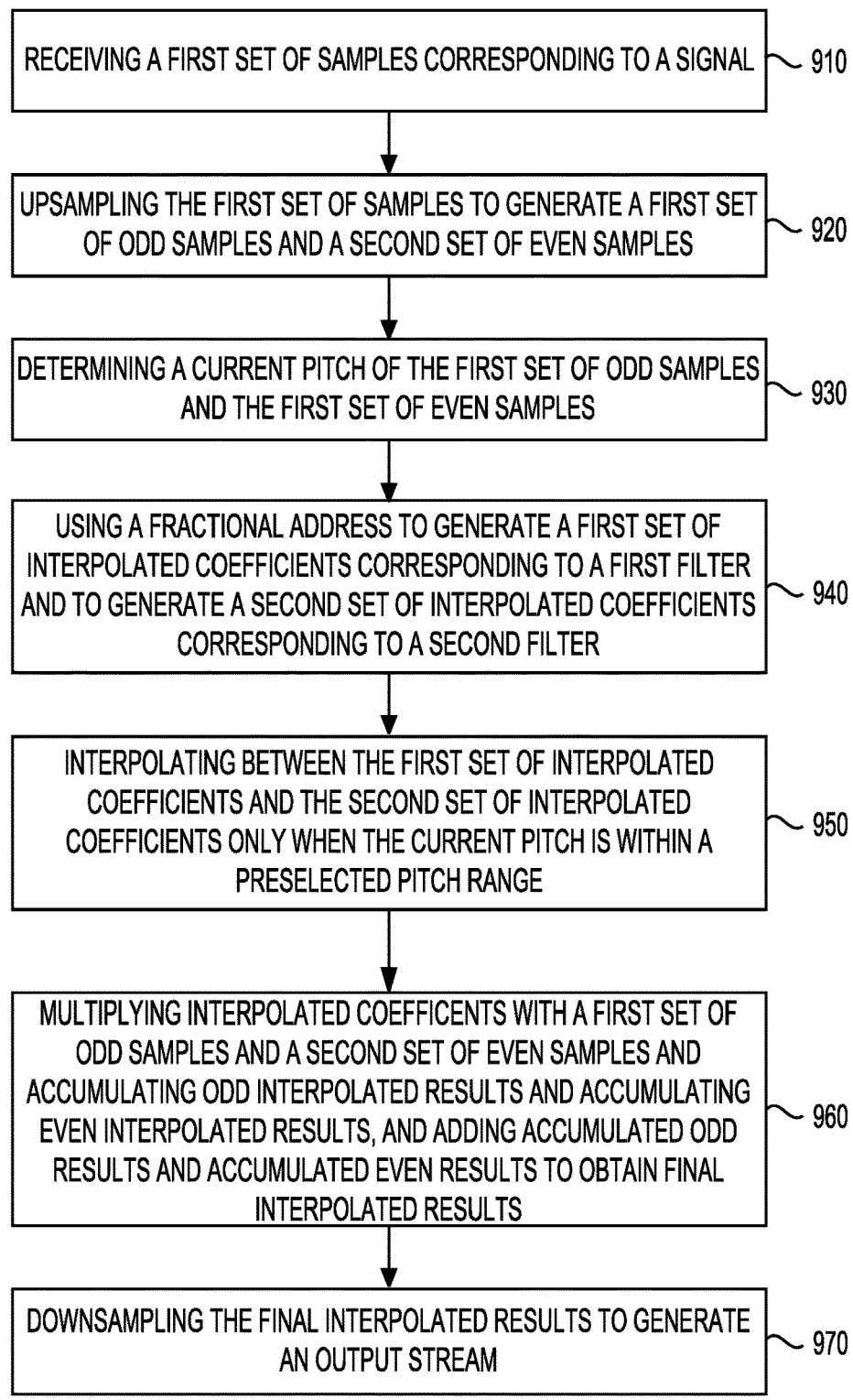
FIG. 9 shows a flow chart including steps of a method related to sample rate conversion in accordance with one example.

FIG. 9 shows a flow chart including steps of a method related to system 100 and sample rate converters 200 and 500 in accordance with one example. In step 910, a sample rate converter (e.g., 200) may receive a first set of samples corresponding to a signal (e.g., an audio signal).

Step 920 may include upsampling the first set of samples to generate a first set of odd samples and a second set of even samples. In this example, the upsampling step may be performed by upsampler 220. As described earlier, this step may include zero-insertion to double (or increase by another multiplier) a sampling rate of the input signal.

Step 930 may include determining a current pitch of the first set of the even samples and the odd samples. As described earlier, SRC 500 may obtain the current pitch. In this example, software corresponding to the audio control processor may provide a predetermined pitch value to SRC 500. Alternatively, the pitch value may be calculated by SRC 500 as described earlier.

Step 940 may include using a fractional address to generate a first set of interpolated coefficients corresponding to a first filter and to generate a second set of coefficients corresponding to a second filter. As described earlier with respect to FIG. 5, SRC 500 may include interpolators that may be used to perform this function. In this example, an interpolator may instead of dividing the pitch value by 2 redefine the binary point of the pitch value such that there are 19 fractional bits, which can be used for interpolation.

Step 950 may include interpolating between the first set of interpolated coefficients and the second set of interpolated coefficients only when the current pitch is within a selected pitch range. This step may be performed by additional interpolators described with respect to SRC 500 in FIG. 5. As an example, when the current pitch is within a set of selected values (e.g., the range of values shown in FIG. 6 earlier) linear interpolator 516 may be used to interpolate between the even interpolated coefficient values for Filter 1 and Filter 2. Similarly, in a parallel data path, linear interpolator 536 may be to interpolate between the odd interpolated coefficient values for Filter 1 and Filter 2.

Step 960 may include multiplying interpolated coefficients with a first set of odd samples and a second set of even samples and accumulating odd interpolated results and accumulating even interpolated results, and adding the accumulated odd interpolated result with the accumulated even interpolated result to obtain final interpolated results. As described earlier with respect to FIG. 5, this step may include using the even accumulators and the odd accumulators to store the interpolation results.

Step 970 may include downsampling the final interpolated results to generate an output stream (e.g., an output audio stream). As an example, a downsampler (e.g., downsampler 240 of FIG. 2) may perform this step. Although FIG. 9 shows the steps listed in a certain order, they need not be performed in that order and additional or fewer steps may be performed. In one particular example, though, steps 910 to 950 must be completed for each coefficient before applying the coefficient to a sample.

Figure 10:
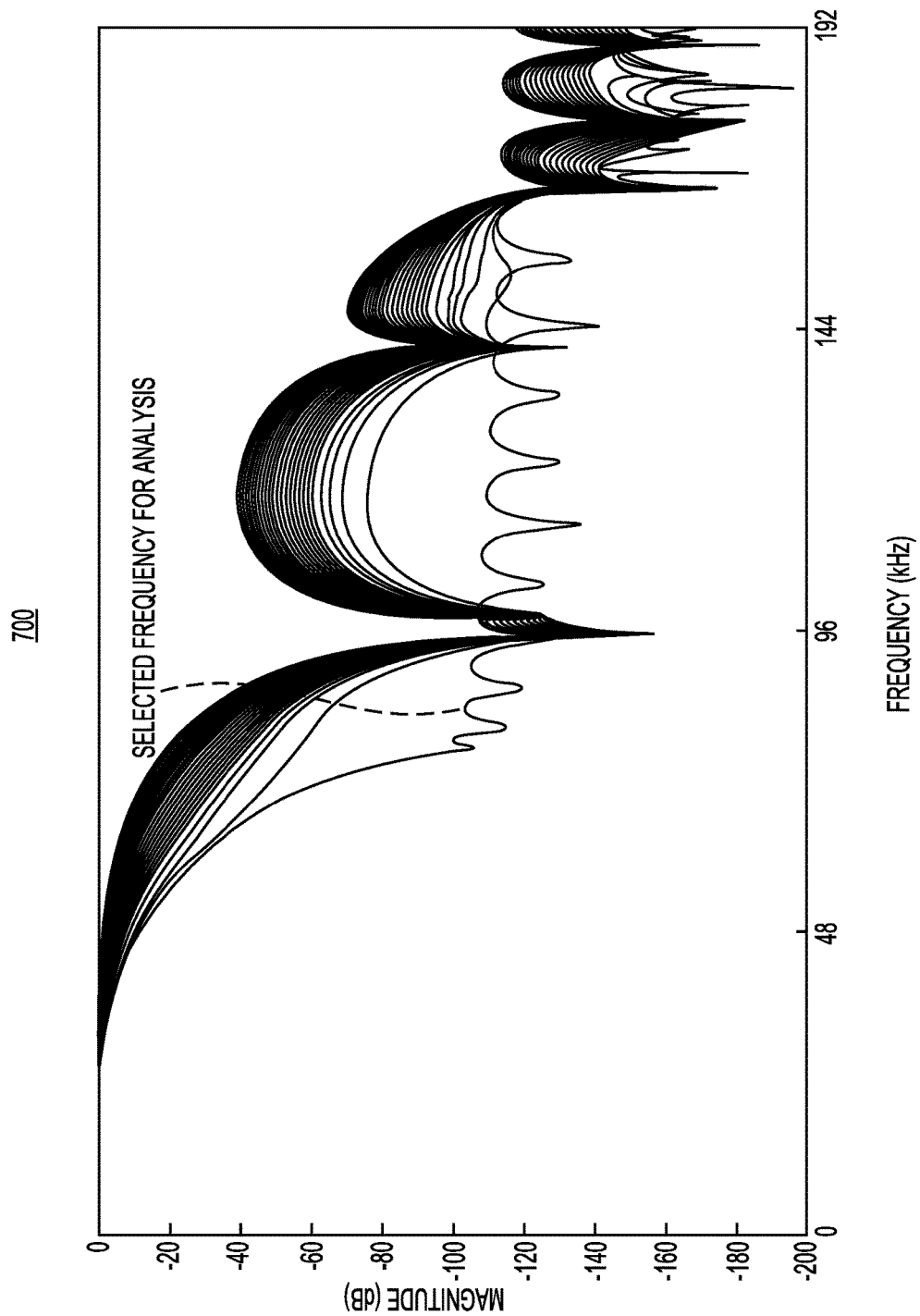
FIG. 10 shows filter interpolation based on linear interpolation in accordance with one example.

FIG. 10 shows the filter interpolation based on linear interpolation alone. In this example, FIG. 10 shows a certain number (e.g., X) of filter responses by stepping 1/X of the distance between the two filters. As an example, if an interpolation is performed using an interpolation fraction of 1/X then one of the filters shown in FIG. 10 will correspond to that fraction. The variation in the magnitude (in dBs) of the filter response as the frequency changes from 0 to 192 kHz is shown in FIG. 10. With linear interpolation alone, the filter response does not change linearly as the interpolation fraction is incremented by 1/X.

Figure 11:
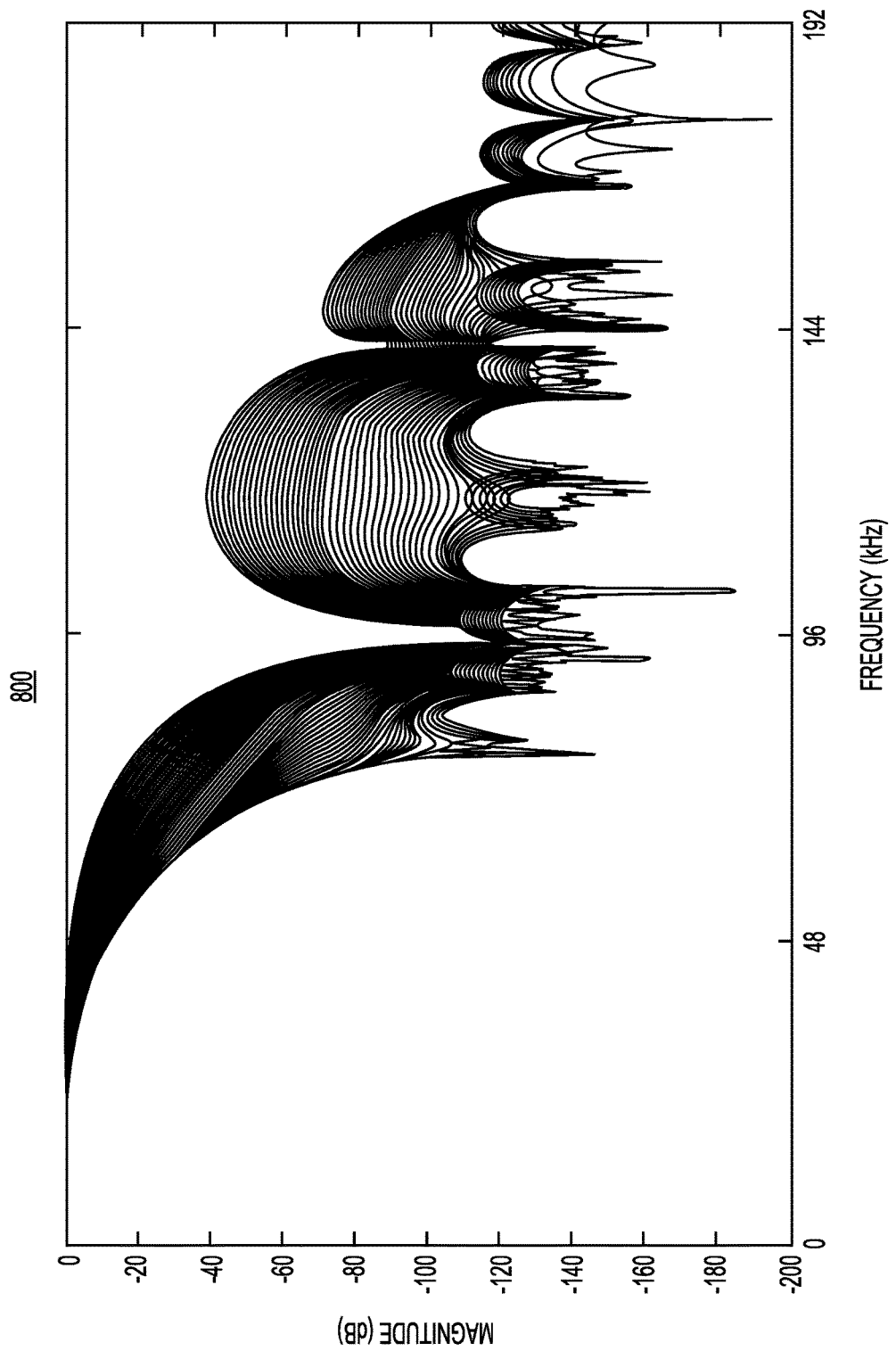
FIG. 11 shows the filter interpolation based on modified fraction values in accordance with one example.

FIG. 11 shows the filter interpolation based on modified fraction values. In this example, SRC 500 uses a lookup table to modify the filter. The variation in the magnitude (in dBs) of the filter response as the frequency changes from 0 to 192 kHz is shown in FIG. 11. In one example, Y may be 64, thus in this case interpolation may be performed using an interpolation fraction of 1/Y. In this case, FIG. 11 may show 64 filter responses for each one of the interpolation fractions. As described earlier with respect to FIG. 5, modified fraction values may be derived from a lookup table to perform the filter interpolation between Filter 1 and Filter 2. In one example, the filter interpolation may have its greatest effect in at least one of the transition bands, shown in FIGS. 7 and 8. Thus, in this example, the frequency that is selected for the analysis (as indicated in FIG. 10) is a frequency that is within a transition band and is identified as causing unacceptable noise. By interpolating between the filters at this selected frequency that provides a linear change in the filter response in the transition band noise may be reduced. Thus, one of the advantages of this process may be smaller noise peaks. In particular, when the pitch is in a range that results in an interpolation between Filter 1 and Filter 2, the noise may be lower in magnitude.

Figure 12:
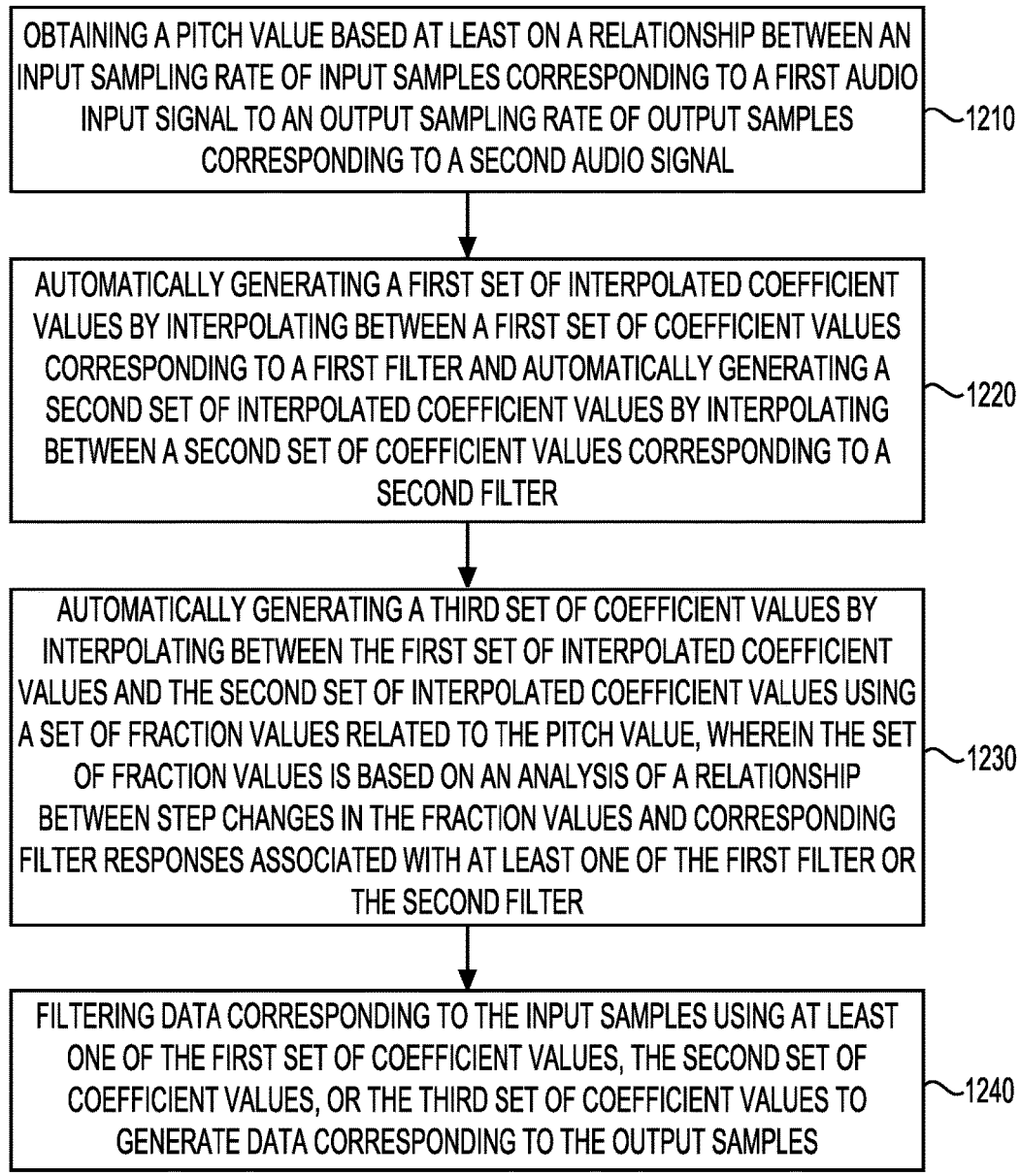
FIG. 12 shows a flow chart of a method in accordance with one example.

FIG. 12 shows a flow chart showing steps of a method related to device 100 in accordance with one example. In one example, this method may be performed using SRC 500. Step 1210 may include obtaining a pitch value based at least on a relationship between an input sampling rate of input samples corresponding to a first audio signal to an output sampling rate of output samples corresponding to a second audio signal. As described earlier, SRC 500 may obtain the current pitch. In this example, software corresponding to the audio control processor may provide a predetermined pitch value to SRC 500. Alternatively, the pitch value may be calculated by SRC 500 as described earlier.

Step 1220 may include automatically generating a first set of interpolated coefficient values by interpolating between a first set of coefficient values corresponding to a first filter and automatically generating a second set of interpolated coefficient values by interpolating between a second set of coefficient values corresponding to a second filter. As described earlier with respect to FIG. 5, SRC 500 may include interpolators that may be used to perform this function. In one example, the input samples may be processed in parallel by processing even samples using one data path and the odd samples using another data path as shown in FIG. 5.

Step 1230 may include automatically generating a third set of coefficient values by interpolating between the first set of interpolated coefficient values and the second set of interpolated coefficient values using a set of fraction values related to the pitch value, where the set of fraction values is determined based on an analysis of a relationship between step changes in the fraction values and corresponding filter responses associated with at least one of the first filter or the second filter. This step may be performed by the additional interpolators described with respect to SRC 500 in FIG. 5. As described earlier, the analysis of the relationship between step changes in the fraction values and corresponding filter responses may be performed by determining breakpoints or step increases that provide a desired filter response at a selected frequency of the audio signal being processed. The results of the analysis, including a mapping between the fraction values and the filter coefficients may be stored in a lookup table. As an example, when the current pitch is within a set of selected values (e.g., the range of values shown in FIG. 6 earlier) linear interpolator 516 may be used to interpolate between the even interpolated coefficient values for Filter 1 and Filter 2. Similarly, in a parallel data path, linear interpolator 526 may be used to interpolate between the odd interpolated coefficient values for Filter 1 and Filter 2. In addition, as described earlier a lookup table may be used for interpolating between the filters. The use of the lookup table may advantageously allow interpolation between the filters using fraction values that have been determined by various methods to ensure that a step increase in the fraction value results in a commensurable filter response. As described earlier, other approaches may be used. In one example, the analysis of the relationship between the step changes in the fraction values and the corresponding filter responses is performed substantially in real time. This may be accomplished using logic blocks that are specifically configured to operate in parallel to process a large number of filter response corresponding to the changes in the fraction values. In another example, the coefficients may be calculated using an algebraic relationship between the filter responses without using a lookup table for fraction mapping.

Step 1240 may include filtering data corresponding to the input samples using the first set of coefficient values, the second set of coefficient values, and the third set of coefficient values to generate the output samples. The steps described with respect to FIG. 12 need not be performed in a certain order and additional or fewer steps may be performed.

In conclusion, in one example, the present disclosure relates to a method comprising obtaining a pitch value based at least on a relationship between an input sampling rate of input samples corresponding to a first audio signal to an output sampling rate of output samples corresponding to a second audio signal. The method further includes automatically generating a first set of interpolated coefficient values by interpolating between a first set of coefficient values corresponding to a first filter and automatically generating a second set of interpolated coefficient values by interpolating between a second set of coefficient values corresponding to a second filter. The method further includes automatically generating a third set of coefficient values by interpolating between the first set of interpolated coefficient values and the second set of interpolated coefficient values using a set of fraction values related to the pitch value, wherein the set of fraction values is determined based on an analysis of a relationship between step increases in the fraction values and a corresponding filter responses associated with at least one of the first filter or the second filter, and wherein the analysis comprises selecting one of the filter responses. The method further includes filtering data corresponding to the input samples using at least one of the first set of coefficient values, the second set of coefficient values, or the third set of coefficient values to generate the output samples.

The analysis of the relationship between the step changes in the fraction values and the corresponding filter responses may be performed based on a selected frequency corresponding to the first audio signal. In addition, the analysis of the relationship between the step changes in the fraction values and the corresponding filter responses may be performed substantially in real time.

The lookup table may be configured to represent at least a portion of the analysis of the relationship between the step changes in the fraction values and the corresponding filter responses.

The first set of samples may comprise a first set of even values and a set of odd values, and the method may further comprise accumulating even interpolated results and accumulating odd interpolated results, where the even interpolated results are based on the even values and the odd interpolated results are based on the odd values.

The method may further include downsampling accumulated results to generate an output audio stream. The method may also include upsampling an input audio stream to generate the input samples.

In another example, the present disclosure relates to a device comprising a sample rate converter configured to obtain a pitch value based at least on a relationship between an input sampling rate of input samples corresponding to a first audio signal to an output sampling rate of output samples corresponding to a second audio signal. The sample rate converter is further configured to automatically generate a first set of interpolated coefficient values by interpolating between a first set of coefficient values corresponding to a first filter and automatically generating a second set of interpolated coefficient values by interpolating between a second set of coefficient values corresponding to a second filter. The sample rate converter is further configured to automatically generate a third set of coefficient values by interpolating between the first set of interpolated coefficient values and the second set of interpolated coefficient values using a set of fraction values related to the pitch value, wherein the set of fraction values is determined based on an analysis of a relationship between step increases in the fraction values and corresponding filter responses associated with at least one of the first filter or the second filter, and wherein the analysis comprises selecting one of the filter responses. The sample rate converter is further configured to filter data corresponding to the input samples using at least one of the first set of coefficient values, the second set of coefficient values, or the third set of coefficient values to generate the output samples.

The analysis of the relationship between the step changes in the fraction values and the corresponding filter responses may be performed based on a selected frequency corresponding to the first audio signal. In addition, the analysis of the relationship between the step changes in the fraction values and the corresponding filter responses may be performed substantially in real time.

The lookup table may be stored in a memory associated with the device and the lookup table may be configured to represent at least a portion of the analysis of the relationship between the step changes in the fraction values and the corresponding filter responses.

The first set of samples may comprise a first set of even values and a set of odd values, and the sample rate converter may further be configured to accumulate even interpolated results and accumulate odd interpolated results, the even interpolated results may be based on the even values and the odd interpolated results may be based on the odd values.

The sample rate converter may further be configured to downsample accumulated results to generate an output audio stream. The sample rate converter may further be configured to upsample an input audio stream to generate the input samples.

In yet another example, the present disclosure relates to a system comprising a buffer configured to store input samples corresponding to an audio signal. The system further includes an audio control processor configured to provide the input samples to the sample rate converter. The sample rate converter is configured to obtain a pitch value from the audio control processor, wherein the pitch value is based at least on a relationship between an input sampling rate of input samples corresponding to a first audio signal to an output sampling rate of output samples corresponding to a second audio signal. The sample rate converter is further configured to automatically generate a first set of interpolated coefficient values by interpolating between a first set of coefficient values corresponding to a first filter and automatically generating a second set of interpolated coefficient values by interpolating between a second set of coefficient values corresponding to a second filter. The sample rate converter is further configured to automatically generate a third set of coefficient values by interpolating between the first set of interpolated coefficient values and the second set of interpolated coefficient values using a set of fraction values related to the pitch value, wherein the set of fraction values is determined based on an analysis of a relationship between step increases in the fraction values and corresponding filter responses associated with at least one of the first filter or the second filter, and wherein the analysis comprises selecting one of the filter responses. The sample rate converter is further configured to filter data corresponding to the input samples using at least one of the first set of coefficient values, the second set of coefficient values, or the third set of coefficient values to generate the output samples.

The analysis of the relationship between the step changes in the fraction values and the corresponding filter responses may be performed based on a selected frequency corresponding to the first audio signal. In addition, the analysis of the relationship between the step changes in the fraction values and the corresponding filter responses may be performed substantially in real time.

The lookup table may be stored in a memory associated with the system and the lookup table may be configured to represent at least a portion of the analysis of the relationship between the step changes in the fraction values and the corresponding filter responses.

The first set of samples may comprise a first set of even values and a set of odd values, and the sample rate converter may further be configured to accumulate even interpolated results and accumulate odd interpolated results, the even interpolated results may be based on the even values and the odd interpolated results may be based on the odd values.

The sample rate converter may further be configured to upsample an input audio stream to generate the input samples. The sample rate converter may further be configured to downsample accumulated results to generate an output audio stream.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method comprising:
    obtaining a pitch value based at least on a relationship between an input sampling rate of input samples corresponding to a first audio signal to an output sampling rate of output samples corresponding to a second audio signal;
    using a fractional address to generate a first set of interpolated coefficient values corresponding to a first filter and to generate a second set of interpolated coefficient values corresponding to a second filter;
    automatically generating a third set of coefficient values by interpolating between the first set of interpolated coefficient values and the second set of interpolated coefficient values using a set of fraction values related to the pitch value, wherein the set of fraction values is determined based on an analysis of a relationship between step changes in the fraction values and corresponding filter responses associated with at least one of the first filter or the second filter; and
    filtering data corresponding to the input samples using at least one of the first set of coefficient values, the second set of coefficient values, or the third set of coefficient values to generate the output samples.

2. The method of claim 1, wherein the analysis of the relationship between the step changes in the fraction values and the corresponding filter responses is performed based on a selected frequency corresponding to the first audio signal.

3. The method of claim 1, wherein a lookup table is configured to represent at least a portion of the analysis of the relationship between the step changes in the fraction values and the corresponding filter responses.

4. The method of claim 1, wherein the analysis of the relationship between the step changes in the fraction values and the corresponding filter responses is performed substantially in real time.

5. The method of claim 1, wherein the first set of samples comprises a first set of even values and a set of odd values, and the method further comprising accumulating even interpolated results and accumulating odd interpolated results, wherein the even interpolated results are based on the even values and the odd interpolated results are based on the odd values.

6. The method of claim 1 further comprising downsampling accumulated results to generate an output audio stream.

7. The method of claim 1 further comprising upsampling an input audio stream to generate the input samples.

8. A device comprising:
    a sample rate converter configured to:
        obtain a pitch value based at least on a relationship between an input sampling rate of input samples corresponding to a first audio signal to an output sampling rate of output samples corresponding to a second audio signal;
        using a fractional address generate a first set of interpolated coefficient values by interpolating between a first set of coefficient values corresponding to a first filter and automatically generating a second set of interpolated coefficient values by interpolating between a second set of coefficient values corresponding to a second filter;
        automatically generate a third set of coefficient values by interpolating between the first set of interpolated coefficient values and the second set of interpolated coefficient values using a set of fraction values related to the pitch value, wherein the set of fraction values is determined based on an analysis of a relationship between step changes in the fraction values and corresponding filter responses associated with at least one of the first filter or the second filter; and
        filter data corresponding to the input samples using at least one of the first set of coefficient values, the second set of coefficient values, or the third set of coefficient values to generate the output samples.

9. The device of claim 8, wherein the analysis of the relationship between the step changes in the fraction values and the corresponding filter responses is performed based on a selected frequency corresponding to the first audio signal.

10. The device of claim 8, wherein a lookup table is stored in a memory associated with the device and wherein the lookup table is configured to represent at least a portion of the analysis of the relationship between the step changes in the fraction values and the corresponding filter responses.

11. The device of claim 8, wherein the analysis of the relationship between the step changes in the fraction values and the corresponding filter responses is performed substantially in real time.

12. The device of claim 8, wherein the first set of samples comprises a first set of even values and a set of odd values, and wherein the sample rate converter is further configured to accumulate even interpolated results and accumulate odd interpolated results, wherein the even interpolated results are based on the even values and the odd interpolated results are based on the odd values.

13. The device of claim 8, wherein the sample rate converter is further configured to downsample accumulated results to generate an output audio stream.

14. The device of claim 8, wherein the sample rate converter is further configured to upsample an input audio stream to generate the input samples.

15. A system comprising:
a buffer configured to store input samples corresponding to an audio signal;
a sample rate converter; and
an audio control processor, wherein the sample rate converter is configured to:
obtain a pitch value from the audio control processor, wherein the pitch value is based at least on a relationship between an input sampling rate of input samples corresponding to a first audio signal to an output sampling rate of output samples corresponding to a second audio signal;
use a fractional address to generate a first set of interpolated coefficient values corresponding to a first filter and to generate a second set of interpolated coefficient values corresponding to a second filter;
automatically generate a third set of coefficient values by interpolating between the first set of interpolated coefficient values and the second set of interpolated coefficient values using a set of fraction values related to the pitch value, wherein the set of fraction values is determined based on an analysis of a relationship between step changes in the fraction values and corresponding filter responses associated with at least one of the first filter or the second filter; and
filter data corresponding to the input samples using at least one of the first set of coefficient values, the second set of coefficient values, or the third set of coefficient values to generate the output samples.

16. The system of claim 15, wherein the analysis of the relationship between the step changes in the fraction values and the corresponding filter responses is performed based on a selected frequency corresponding to the first audio signal.

17. The system of claim 16, wherein a lookup table is stored in a memory associated with the system and wherein the lookup table is configured to represent at least a portion of the analysis of the relationship between the step changes in the fraction values and the corresponding filter responses.

18. The system of claim 16, wherein the analysis of the relationship between the step changes in the fraction values and the corresponding filter responses is performed substantially in real time.

19. The system of claim 17, wherein the first set of samples comprises a first set of even values and a set of odd values, and wherein the sample rate converter is further configured to accumulate even interpolated results and accumulate odd interpolated results, wherein the even interpolated results are based on the even values and the odd interpolated results are based on the odd values.

20. The system of claim 15, wherein the sample rate converter is further configured to:
upsample the audio signal to generate the input samples; and
downsample the accumulated results to generate an output audio stream.

* * * * *